United States Patent [19]
Banerjee et al.

[11] Patent Number: 5,537,355
[45] Date of Patent: Jul. 16, 1996

[54] SCHEME TO TEST/REPAIR MULTIPLE LARGE RAM BLOCKS

[75] Inventors: Pradip Banerjee; Atul V. Ghia, both of San Jose; Patrick Chuang, Cupertino, all of Calif.

[73] Assignees: Sony Corporation of Japan; Sony Electronics, Inc., Park Ridge, N.J.

[21] Appl. No.: 346,740

[22] Filed: Nov. 30, 1994

[51] Int. Cl.$^6$ ............................................. G06F 11/22
[52] U.S. Cl. ............... 365/201; 365/189.01; 365/189.02; 365/230.02
[58] Field of Search ........................... 395/425; 365/200, 365/207

[56] References Cited

U.S. PATENT DOCUMENTS 5,276,833  1/1994  Auvinen et al. ......................... 395/425
5,287,481  2/1994  Lin ........................................... 395/425

Primary Examiner—Viet Q. Nguyen
Attorney, Agent, or Firm—Irell & Manella

[57] ABSTRACT

The method and apparatus of the present invention provides an interface between a testing device and a random access memory (RAM). The RAM comprises two types of RAM, a TAG RAM and a data RAM. In normal operation, the TAG RAM is not coupled to any devices external to the RAM. Thus, to test the TAG RAM, means must be provided to couple the testing device with the RAG RAM. One possible configuration for interface the TAG RAM with the testing device is to dedicate a line from the testing device to the TAG RAM for each output pin of the testing device, which significantly increases the size of the chip. To reduce this increase in size, according to the present invention, the write lines from the testing device share the bus used by the TAG RAM during normal operation. A multiplexer selects between the testing data and normal address data to insure the integrity of data over the bus. By sharing lines according to the present invention, a TAG RAM may be interfaced to a testing device with a minimum expansion of chip size.

9 Claims, 4 Drawing Sheets

SCHEME TO TEST/REPAIR MULTIPLE LARGE RAM BLOCKS

BACKGROUND OF THE INVENTION

1. Field of the Invention

The invention relates to integrated circuit memories and, more specifically, to a method and apparatus for testing multiple random access memory (RAM) blocks.

2. Art Background

Random access memories (RAM) are common devices used in computers and many other digital systems. When a monolithic RAM is fabricated, errors in the fabrication process may render elements of the RAM defective. To avoid accessing the defective elements of the RAM, the defective elements are located and bypassed. The defective elements are located by a testing technique that reads and writes data to each memory cell (one bit) in the RAM to determine whether the particular cell is functioning properly.

In an integrated cache memory device as disclosed in a related application, "Integrated Cache Memory," filed Dec. 8, 1994, Ser. No. 08/351,900, a cache RAM is divided into two elements, a data RAM and a TAG RAM, and each element must be thoroughly tested. A data RAM stores data that it transfers to a central processing unit (CPU) or a storage device such as a disk drive. A TAG RAM stores higher order addresses. When the contents of the internal TAG RAM are equal to the higher order address of an accessed memory cell, the data RAM is enabled to access the data bus. The TAG RAM is provided the addresses that it stores by a controller internal to the RAM memory and the TAG RAM provides data only to the data RAM and controller in a normal mode of operation. Thus, as previously stated, in normal mode, the TAG RAM does not provide data to any devices external to the RAM memory or receive data to be written from any external devices. In test mode, however, the TAG RAM must be accessed so that it may be tested and repaired.

Since the TAG RAM must be tested, lines must be added to the memory to allow the TAG RAM to interface with a testing device. If there are N blocks of TAG RAM corresponding to N blocks of data RAM, and each TAG RAM has 20 tag bits that need to be interfaced with the testing device, 2 * 20 * N lines would need to be added to the memory solely for purposes of testing the TAG RAM. The factor of 2 arises because separate lines must be added for read and write operations since a TAG RAM, unlike a data RAM, requires separate interfaces for read and write operations. These additional lines occupy a relatively large amount of chip area because the lines must couple the TAG RAM with an I/O strucutre that interfaces with the testing device and the I/O structure is typically located relatively far from the TAG RAM. Thus, the lines required for testing the TAG RAM greatly increase the size of the RAM.

As will be described, the present invention overcomes the limitations of the prior art by providing a method and apparatus for testing multiple blocks of TAG RAM with only a modest increase in the size of the RAM.

SUMMARY OF THE INVENTION

The method and apparatus of the present invention provides an interface between a testing device and a random access memory (RAM). The RAM comprises two types of RAM, a TAG RAM and a data RAM. In normal mode operation, the TAG RAM receives and writes higher order addresses or compares higher order addresses with the higher order address of an accessed memory cell to determine a hit or a miss. In normal mode, the TAG RAM does not provide data to any devices external to the device. Thus, to test the TAG RAM, a mechanism must be provided to couple the testing device with the TAG RAM. One possible configuration for interfacing the TAG RAM with the testing device is to dedicate a line from the testing device to the TAG RAM for each of the TAG RAM higher order address bits. Connecting the TAG RAM with the testing device by a plurality of uninterrupted lines, however, significantly increases the size of the chip. To reduce this increase in size, according to the present invention, the write lines from the testing device share the bus used by the TAG RAM during normal operation. A multiplexer selects between the testing data and normal address data to insure the integrity of data over the bus. By sharing lines according to the present invention, a TAG RAM may be interfaced to a testing device with a relatively modest expansion of chip size.

DETAILED DESCRIPTION OF THE INVENTION

The present invention discloses random access memory (RAM) with a TAG RAM that is efficiently configured for testing. Although the present invention is described with reference to specific circuits, block diagrams, and signals, etc., it will be appreciated by one of ordinary skill in the art that such details are disclosed simply to provide a more thorough understanding of the present invention. For example, a TAG RAM is shown with 20 input/output lines while a TAG RAM may have any number of input/output lines. It will therefore be apparent to one skilled in the art that the present invention may be practiced without these specific details. In other instances, well known circuits are shown in block diagram form in order not to obscure the present invention unnecessarily.

Figure 1:
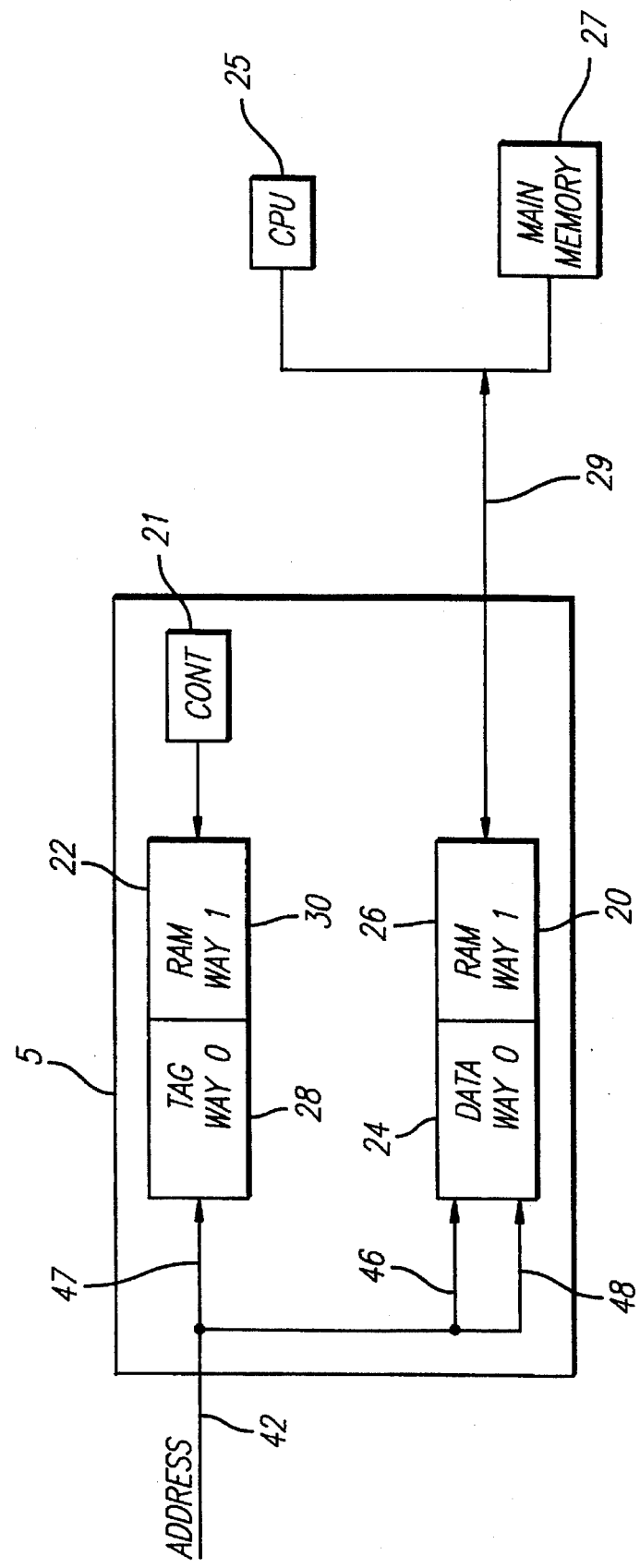
FIG. 1 is a block diagram of a computer system that includes a random access memory (RAM) with a TAG RAM and a data RAM.

FIG. 1 illustrates a digital system that includes a random access memory (RAM) 5. As illustrated in the figure, the system includes the RAM 5 coupled to a CPU 25 and a main memory 27 over a bus 29. Data may be transferred between the CPU 25 and the RAM 5 and the main memory 27 and the RAM 5 over the bus 29.

As illustrated in FIG. 1, the RAM 5 further comprises a data RAM 20 and a TAG RAM 22. The data RAM 20 stores data that is transferred to the central processing unit (CPU) 25 or a storage device such as the main memory 27. The TAG RAM 22 stores higher order addresses. When the contents of the TAG RAM 22 are equal to the higher order address of an accessed memory cell, the data RAM 20 is enabled to access the data bus 29. In particular, as illustrated in FIG. 1, the data RAM 20 further comprises two blocks, 24 and 26, and the TAG RAM 22 further comprises two corresponding blocks, 28 and 30. If the high order part of the address of the accessed memory cell matches the address stored in block 28, then the corresponding cell in block 24 is read or written. Similarly, if a match occurs in block 30, the corresponding cell in block 26 is read or written. The TAG RAM 22 and a controller 21 are provided addresses externally as shown in the figure. The TAG RAM 22 provides a hit or miss signal to the data RAM 20.

The data RAM 20 is provided with addresses of data over busses 46 and 48 which are in turn coupled to a main address bus 42. The TAG RAM 22 is coupled to the main address bus 42 through bus 47. The lower order addresses that are provided to the TAG RAM 22 select a particular cell corresponding to an address in the data RAM 20. The higher order addresses that are provided to the TAG RAM 22 are compared with the stored tag bits. If a match occurs, the corresponding cell from the data RAM 20 is read or written.

The circuit layout illustrated in FIG. 1 does not allow any data to be read from the TAG RAM 22 to an external device or to be written to the TAG RAM 22. As previously described, the TAG RAM 22 receives addresses from an external source but these addresses are used only to select a cell and compare with the contents of that cell. The data that is written into the TAG RAM 22 is provided over line 47 as higher order addresses which are called tag bits. Similarly, as illustrated in FIG. 1, data cannot be read from TAG RAM 22 to a device external to the RAM 5. Interfacing the TAG RAM 22 with an external device is required for testing the TAG RAM 22.

Both the TAG RAM and the data RAM must be tested to determine whether the memories were properly fabricated. To test a RAM, a testing device is coupled to the RAM and writes to each cell (one bit) in the RAM and these cells are then read to determine whether a particular cell is functioning properly. Since, as previously described, the TAG RAM 22 does not communicate with any devices external to the RAM 5 for reading purposes, testing lines must be added to the RAM 5 to couple a testing device with the TAG RAM 22.

Figure 2:
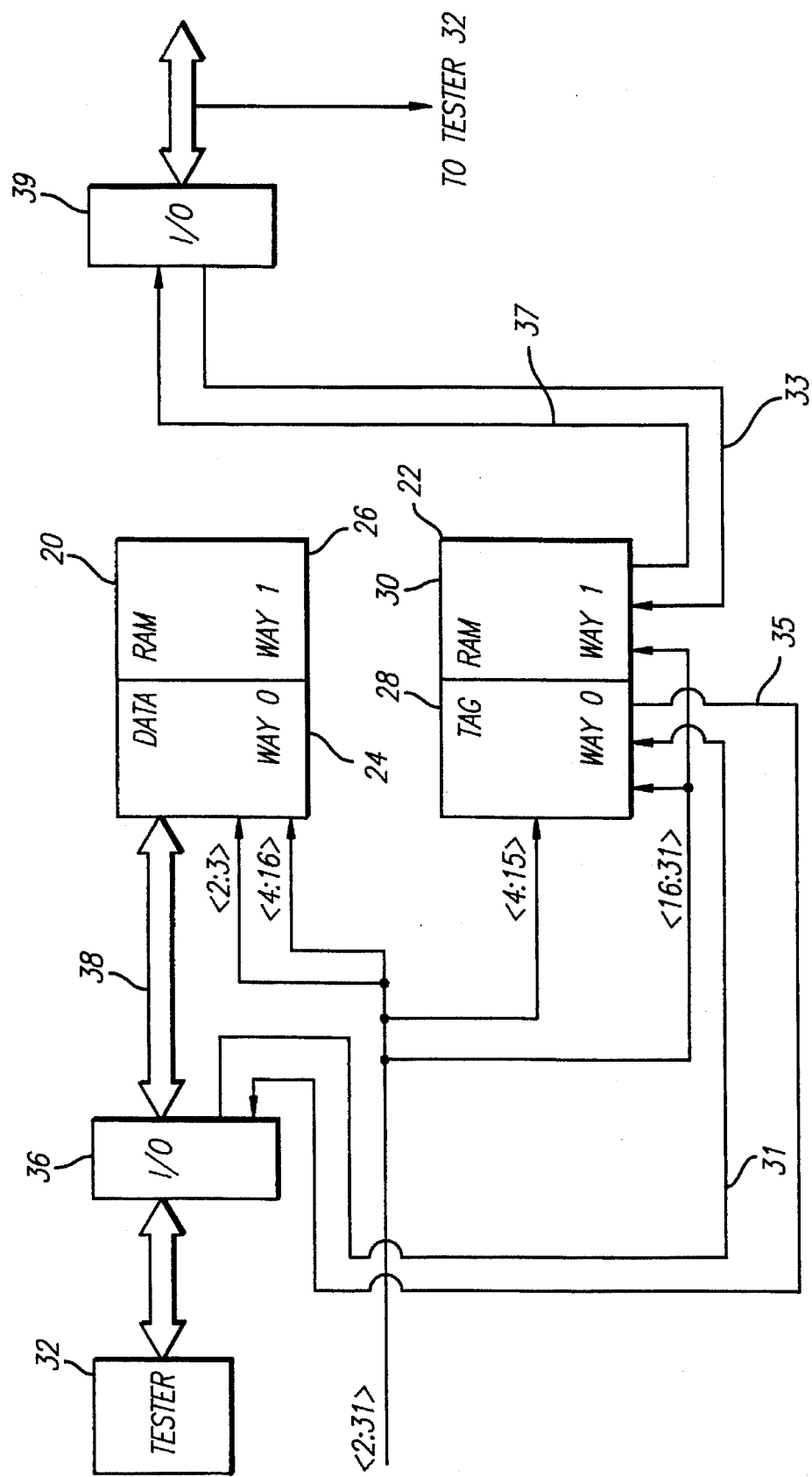
FIG. 2 is an illustration of one possible circuit configuration for interfacing a TAG RAM with a testing device.

FIG. 2 illustrates one possible circuit layout for interfacing the TAG RAM 22 with an external testing device 32. The testing device 32 is coupled to the TAG RAM 22 through an input/output (I/O) device 36, which is coupled to block 28 of the TAG RAM 22 over a 20 bit bus 31 and a 20 bit bus 35. Similarly, the testing device 32 is coupled to block 30 of the TAG RAM 22 through an I/O device 39, which is coupled to block 30 over a 20 bit bus 33 and a 20 bit bus 37. The busses 35 and 37 allow data to be read from the TAG RAM 22 to the testing device 32 while the busses 31 and 33 allow data to be written to the TAG RAM 22 from the testing device 32. Thus, according to the layout illustrated in FIG. 2, to interface the TAG RAM 22 with testing device 32 requires 80 additional lines, which substantially increases the size of the RAM 5.

Figure 3:
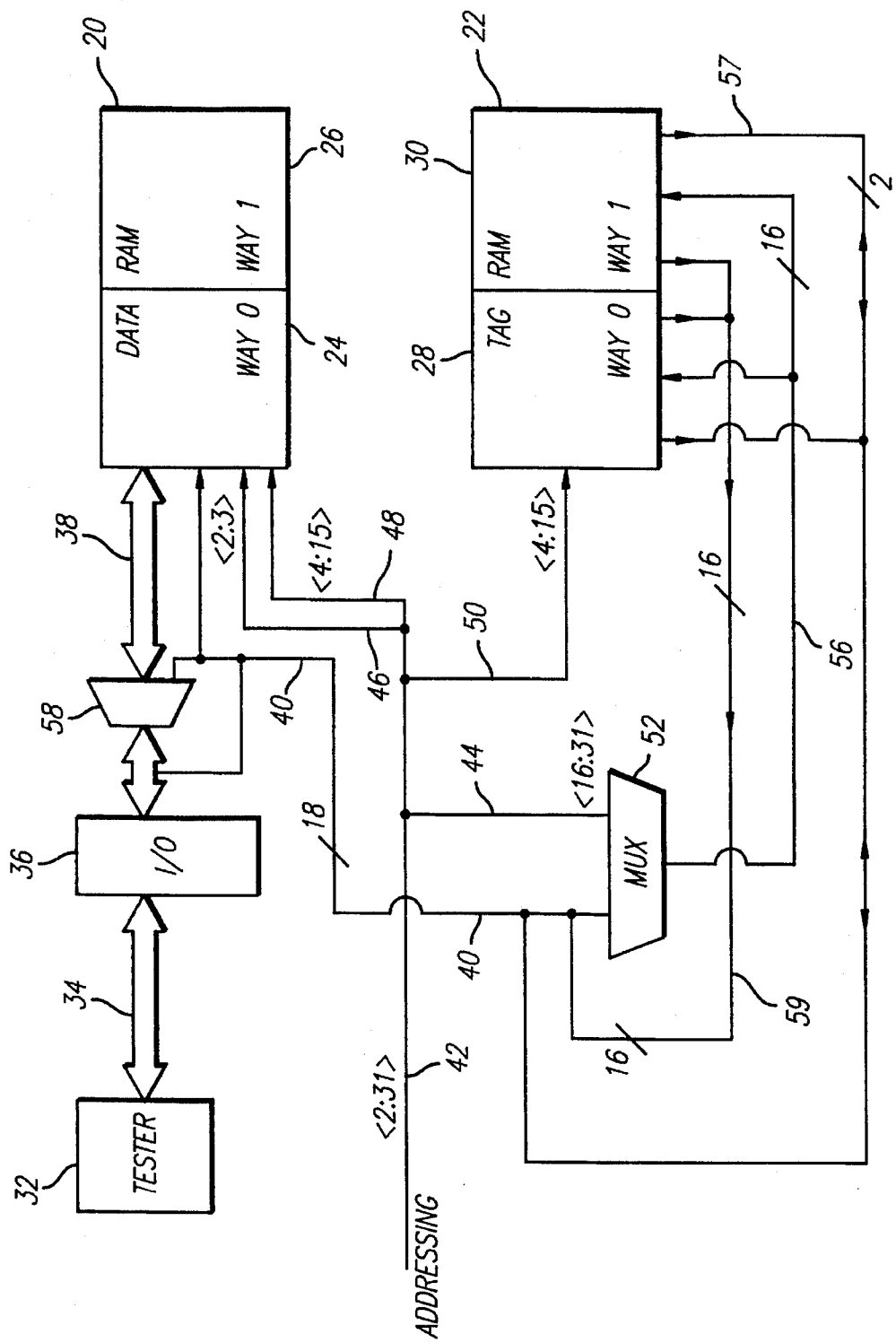
FIG. 3 is an illustration of the configuration of the present invention for interfacing a TAG RAM with a testing device.

FIG. 3 illustrates a RAM memory coupled to a testing device according to the present invention. The data RAM 20 is coupled to the testing device 32 through the I/O device 36, a multiplexer 58 and busses 34 and 38. The TAG RAM 22 is coupled to the tester 32 through multiplexers 52 and 58 and the I/O device 36 and busses 34, 40, 56, 57 and 59. The multiplexer 58 selects between data from the data RAM 20 and the TAG RAM 22.

To write test data to the TAG RAM 22, test data provided over the bus 40 is selected by a signal provided to the multiplexer 52 and the write test data is then provided over the bus 56 to the TAG RAM 22. The selection signal provided to the multiplexer 52 will be described more fully below. An additional two bits of test data are written to the TAG RAM 22 over a bidirectional bus 57. In normal mode, address data provided over the bus 44 is selected by a signal provided to the multiplexer 52 and the address data is provided to the TAG RAM 22 over the bus 56.

To read from the TAG RAM 22 to the testing device 32, the busses 57 and 59 are coupled to each block 28 and 30 of the TAG RAM 22. The busses 57 and 59 are further coupled to the bus 40. Bus 59 is a 16 bit unidirectional bus that is provided with address data from the TAG RAM 22 and bus 57 is a bidirectional two bit bus as previously described. The separate busses 57 and 59 are required since the write interfaces to the TAG RAM 22 can not accommodate read operations.

Normal mode addressing is conventional, as illustrated in FIG. 3. In normal mode, the full 30 bit address of a selected memory cell is provided over the bus 42. The <2:3> address bits are provided to the data RAM 20 over bus 46 and the <4:15> address bits are provided to the data RAM 20 over bus 48. The <4:15> address bits are provided to the TAG RAM 22 over a bus 50.

In the preferred embodiment, the data RAM 20 consists of two blocks, 24 and 26. The TAG RAM 22 has corresponding blocks 28 and 30 and each block 28 and 30 must be separately tested. As will readily be appreciated by a person of ordinary skill in the art, additional blocks may be added to the TAG RAM 22 where each additional block shares the bus 56.

The present invention as illustrated in FIG. 3 results in a significantly smaller chip than the layout illustrated in FIG. 2. Instead of adding 80 lines to interface the blocks 28 and 30 with the testing device 32, as illustrated in FIG. 2, the layout as illustrated in FIG. 3 adds only 18 lines and the multiplexer 52. As will readily be appreciated, for memories with more than two blocks, the present invention results in an even greater savings of chip size area compared to a RAM where testing lines are dedicated to each block of a TAG RAM.

Figure 4:
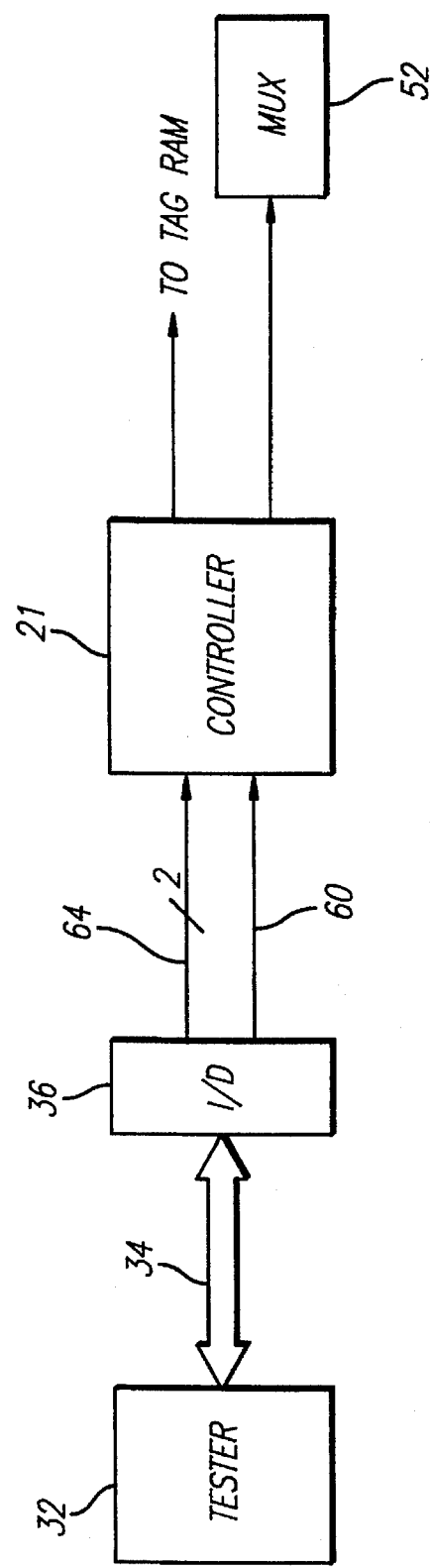
FIG. 4 illustrates the interface between the testing device and a controller within the RAM.

FIG. 4 illustrates an interface between the testing device 32 and a controller 21. The controller 21 resides next to the TAG RAM 22 as illustrated in FIG. 1 and is coupled to the testing device 32 through the I/O device 36 and busses 60 and 64. As illustrated in FIG. 4, the bus 60 provides the controller 21 with control signals that cause the controller 21 to provide a test mode selection input to the multiplexer 52 such that the multiplexer 52 selects test data as previously described. A block selection line of the bus 64 provides the controller 21 with selection signals to select between block 28 and block 30 for TAG RAM testing and blocks 24 and 26 for data RAM 20 read and write operations.

In the preferred embodiment, the testing device 32 accesses the TAG RAM 22 in two phases. In the preferred embodiment, the TAG RAM 22 has 20 input/output lines that must be interfaced with the testing device 32. Thus, a read operation or a write operation may occur in two phases, with 18 bits being read or written in the first phase and two bits being read or written in the second phase. A phase selection line from the bus 64 provides the controller 21 with the proper phase. The controller 21 in turn causes the appropriate bits to be read or written over the busses 56, 57 and 59 as illustrated in FIG. 3. Accessing the TAG RAM 22 in two phases decreases the number of lines that must be added to the RAM 5 while increasing the amount of time required to test the TAG RAM 22.

While the invention has been described in conjunction with the preferred embodiment, it is evident that numerous alternatives, modifications, variations and uses will be apparent to those skilled in the art in light of the foregoing description. For example, the bidirectional bus 57 may be omitted and the TAG RAM 22 may be accessed in only one phase or more than two phases. Many other adaptations of the present invention are possible.

We claim:

1. An integrated circuit random access memory (RAM) that may be tested by a testing device, the RAM comprising:

a data RAM with at least one data block;

a TAG RAM with at least one data block;

an address bus;

a bidirectional testing bus coupled to the testing device;

a read testing bus coupling the testing device to the TAG RAM, the read testing bus coupled to the bidirectional testing bus at a common node; and a first multiplexer with at least two inputs, one input of the first multiplexer coupled to the bidirectional testing bus and another input coupled to the address bus and the output of the first multiplexer coupled to at least one of the blocks of the TAG RAM, the first multiplexer selecting between write testing data and address data to be provided to the TAG RAM.

2. The RAM of claim 1 further comprising an input/output device coupled to the testing device and the bidirectional testing bus.

3. The RAM of claim 1 further comprising a controller coupled to a selection input of the first multiplexer to provide a signal to select test data provided by the testing device.

4. The RAM of claim 1 further comprising a second multiplexer with at least two inputs, one input coupled to the data RAM and the other input coupled to the testing device, the output of the second multiplexer coupled to the input/output device.

5. In an integrated circuit random access memory (RAM) with a TAG RAM with at least one data block, and a data RAM with at least one data block, a method for testing the RAM comprising the steps of:

providing write test data from a testing device, over a bidirectional data bus, to a selection device;

selecting between write test data and address data;

providing the write test data to at least one block of the TAG RAM; and reading test data from the TAG RAM over a read bus that shares a common node with the bidirectional data bus.

6. The method according to claim 5 wherein the selection device comprises a multiplexer.

7. The method according to claim 6 further comprising the steps of:

providing control signals from the testing device to a controller; and providing a selection signal from the controller to the selection device to select the write test data.

8. The method according to claim 5 wherein the TAG RAM comprises at least two blocks, the method further comprising the steps of:

providing control signals from the testing device to a controller; and providing control signals from the controller to the TAG RAM to select a block of the TAG RAM for a read or write operation.

9. The method according to claim 8 further comprising the steps of:

performing a read or write operation for a first plurality of bits in the TAG RAM; and performing a read or write operation for a second plurality of bits in the TAG RAM.

* * * * *